(12) United States Patent
Choi et al.

(10) Patent No.: US 11,431,299 B2
(45) Date of Patent: Aug. 30, 2022

(54) BIAS CIRCUIT AND AMPLIFYING DEVICE WITH TEMPERATURE COMPENSATION

(71) Applicant: SAMSUNG ELECTRO-MECHANICS CO., LTD., Suwon-si (KR)

(72) Inventors: Kyu Jin Choi, Suwon-si (KR); Je Hee Cho, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 119 days.

(21) Appl. No.: 16/534,117

(22) Filed: Aug. 7, 2019

(65) Prior Publication Data

US 2020/0336116 A1    Oct. 22, 2020

(30) Foreign Application Priority Data

Apr. 18, 2019    (KR) .......................... 10-2019-0045558

(51) Int. Cl.
*H03F 1/30*    (2006.01)
*H03F 3/21*    (2006.01)

(52) U.S. Cl.
CPC .............. *H03F 1/302* (2013.01); *H03F 3/21* (2013.01); *H03F 2200/165* (2013.01); *H03F 2200/451* (2013.01)

(58) Field of Classification Search
CPC ...... H03F 1/302; H03F 3/21; H03F 2200/165; H03F 2200/451; H03F 2200/447; H03F 2200/18; H03F 3/195; H03F 3/245
USPC .......................................... 330/289, 296, 285
See application file for complete search history.

(56) References Cited

U.S. PATENT DOCUMENTS

| | | | |
|---|---|---|---|
| 6,452,454 B1 * | 9/2002 | Shapiro | H03F 1/302 330/288 |
| 7,768,354 B2 * | 8/2010 | Matsuda | H03F 1/302 330/299 |
| 2004/0189398 A1 | 9/2004 | Noh et al. | |
| 2006/0232341 A1 * | 10/2006 | Iwata | H03F 3/189 330/296 |

FOREIGN PATENT DOCUMENTS

KR    2003-0031073 A    4/2003

* cited by examiner

*Primary Examiner* — Khanh V Nguyen
*Assistant Examiner* — Khiem D Nguyen
(74) *Attorney, Agent, or Firm* — NSIP Law

(57) ABSTRACT

A bias circuit includes a current generating circuit generating an internal base current based on a reference current, a bias output circuit generating a base bias current based on the internal base current and outputting the base bias current to an amplifying circuit, and a temperature compensation circuit regulating the base bias current based on a temperature voltage reflecting a change in ambient temperature.

18 Claims, 8 Drawing Sheets

BIAS CIRCUIT AND AMPLIFYING DEVICE WITH TEMPERATURE COMPENSATION

CROSS-REFERENCE TO RELATED APPLICATION(S)

This application claims the benefits under U.S.C. § 119(a) of Korean Patent Application No. 10-2019-0045558 filed on Apr. 18, 2019 in the Korean Intellectual Property Office, the entire disclosure of which is incorporated herein by reference for all purposes.

BACKGROUND

Field

The following description relates to a bias circuit having a temperature compensation function and an amplifying device.

Description of Background

In general, a wireless communication system includes an amplifying device for amplifying a transmitted signal. In order to meet the demand for the diffusion of multimedia services of a wireless communications system and high-speed communications function, research for the continuous development of technology and improvements of broadband characteristics and nonlinear characteristics is being continued.

In an amplifying device, the linearity of a power amplifier such as a heterojunction bipolar transistor (HBT) and a bias level have a strong correlation. In general, when a power transistor is biased to a high level, it has the excellent linearity performance.

However, when the amplifying device is operated at a high temperature, a turn-on voltage Vth of the PN junction between the base and the emitter (base-emitter) is lowered due to the temperature characteristics of a device of the HBT. In this case, a base bias level becomes low as well.

Accordingly, due to the base bias level being lowered during a high temperature operation, there may be a problem in that linearity of the power amplifier is deteriorated. In order to overcome such a problem, a solution has been proposed, in which a proportion to absolute temperature (PTAT) bias for increasing an external bias current when an amplifier is operated at a high temperature is used. However, in such a method, there may be a technical difficulty, such as a temperature of a HBT power transistor being accurately sensed, and an external circuit is additionally required to implement this, so a circuit, included in an amplifying device, may become more complicated.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

A bias circuit and an amplifying device, capable of compensating a base bias current which may vary, depending on an ambient temperature, using temperature characteristics of a diode and a current sinking method for reflecting a change in ambient temperature, in a current bias circuit.

In one general aspect, a bias circuit includes: a current generating circuit generating an internal base current based on a reference current; a bias output circuit generating a base bias current based on the internal base current and outputting the base bias current to an amplifying circuit; and a temperature compensation circuit regulating the base bias current based on a temperature voltage reflecting a change in ambient temperature.

In another general aspect, an amplifying device includes: a current generating circuit generating an internal base current based on a reference current; a bias output circuit generating a base bias current based on the internal base current; an amplifying circuit including an amplifying transistor receiving the base bias current; and a temperature compensation circuit regulating the base bias current based on a temperature voltage that reflects a change in ambient temperature.

The current generating circuit may include: a first resistor having a first end connected to a terminal of the reference current; a first diode and a second diode connected to each other in series between a second end of the first resistor and a first end of a second resistor; and the second resistor connected between the second diode and the ground.

The current generating circuit may output the temperature voltage at a connection node between the first diode and the second diode.

The second diode may have temperature characteristics the same as temperature characteristics of a base-emitter PN junction of an amplifying transistor included in the amplifying circuit.

The bias output circuit may include: an output transistor having a base connected to a connection node between the first resistor and the first diode, a collector connected to a terminal of a power supply voltage, and an emitter connected to the amplifying circuit.

The output transistor may amplify the internal base current input to the base, and output the base bias current through the emitter.

The temperature compensation circuit may include: a third resistor having a first end connected to a connection node between the first diode and the second diode; a fourth resistor having a first end connected to a base of the output transistor; a compensation transistor having a base connected to a second end of the third resistor, a collector connected to a second end of the fourth resistor, and an emitter connected to the ground; and a first capacitor connected between the base of the compensation transistor and the ground. The fourth resistor may provide an isolation function between the collector of the compensation transistor and the base of the output transistor, and the third resistor and the first capacitor may form a low pass filter.

The compensation transistor may regulate a current of the internal base current sinking to the ground, according to a magnitude of the temperature voltage.

In another general aspect, an apparatus includes: a first transistor to generate and output a base bias current based on a received internal base current; a second transistor to receive the base bias current; and a third transistor configured to adjust a base voltage of the second transistor based on a change in ambient temperature.

The apparatus may include: a first diode; and a second diode connected in series with the first diode. A temperature voltage corresponding to the change in ambient temperature may be output to the base of the third transistor at a connection node between the first diode and the second diode.

Temperature characteristics of the second diode may be the same as temperature characteristics of the third transistor.

The third transistor may adjust a magnitude of a current of the internal base current sinking to the ground based on a magnitude of the temperature voltage.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
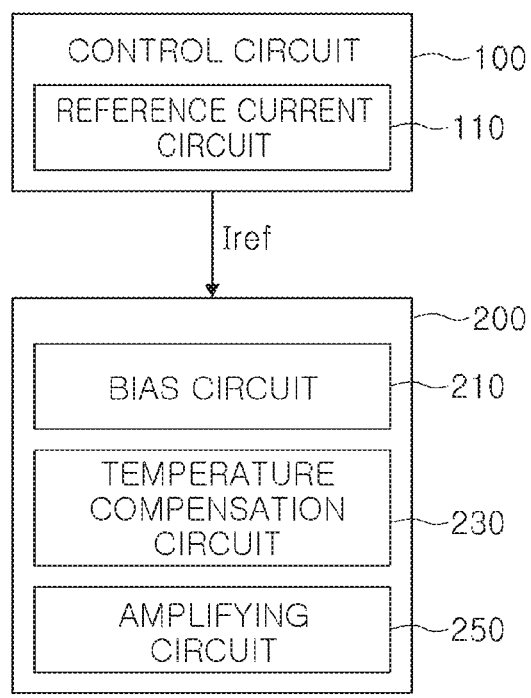
FIG. 1 is a view of an amplifying device according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a view of an amplifying device according to an example.

Referring to FIG. 1, an amplifying device may include a control circuit 100 and a power amplifier circuit 200.

The control circuit 100 may include a reference current circuit 110. The reference current circuit 110 may generate a reference current Iref and output the reference current Iref to the power amplifying circuit 200.

The power amplifying circuit 200 may include a bias circuit 210, a temperature compensation circuit 230, and an amplifying circuit 250.

Figure 2:
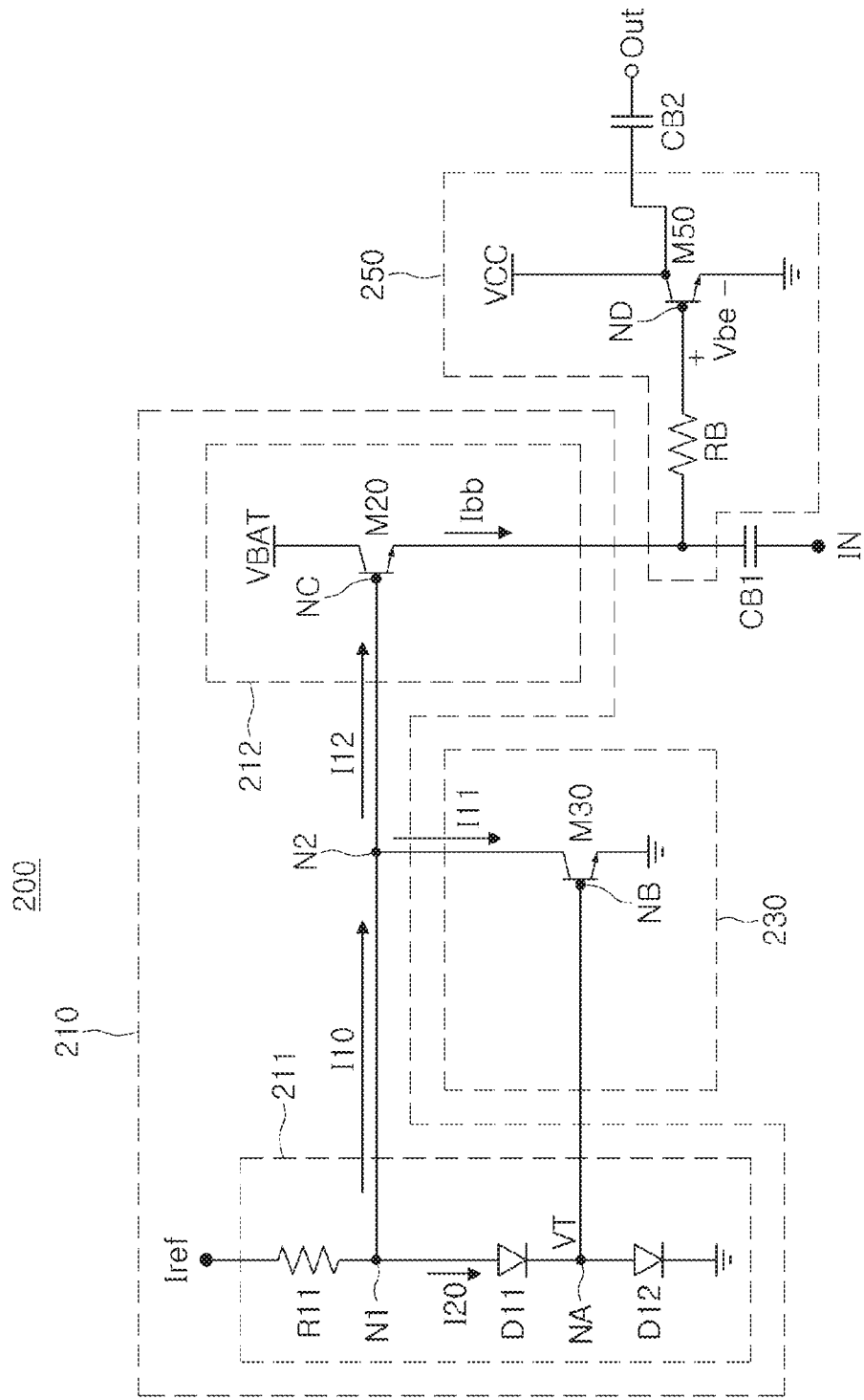
FIG. 2 is a view of a bias circuit and an amplification circuit according to an example.

FIG. 2 is a view of a bias circuit and an amplification circuit according to an example.

Referring to FIGS. 1 and 2, the bias circuit 210 may include a current generating circuit 211 and a bias output circuit 212.

The current generating circuit 211 may generate an internal base current I10 based on a reference current Iref. As an example, the current generating circuit 211 may include a first resistor R11, a first diode D11, and a second diode D12.

The first resistor R11 may include one end connected to a terminal of the reference current Iref, and the other end connected to an anode of the first diode D11.

The first diode D11 and the second diode D12 may be connected to each other in series between the other end of the first resistor R11 and the ground. The first diode D11 may include an anode connected to the other end of the first resistor R11 and receive current I20, and a cathode connected to an anode of the second diode D12. The second diode D12 may include an anode connected to the cathode of the first diode D11, and a cathode connected to the ground.

For each drawing, unnecessary redundant explanations may be omitted for components having the same reference numerals and the same function, and differences for each drawing will be explained.

Figure 3:
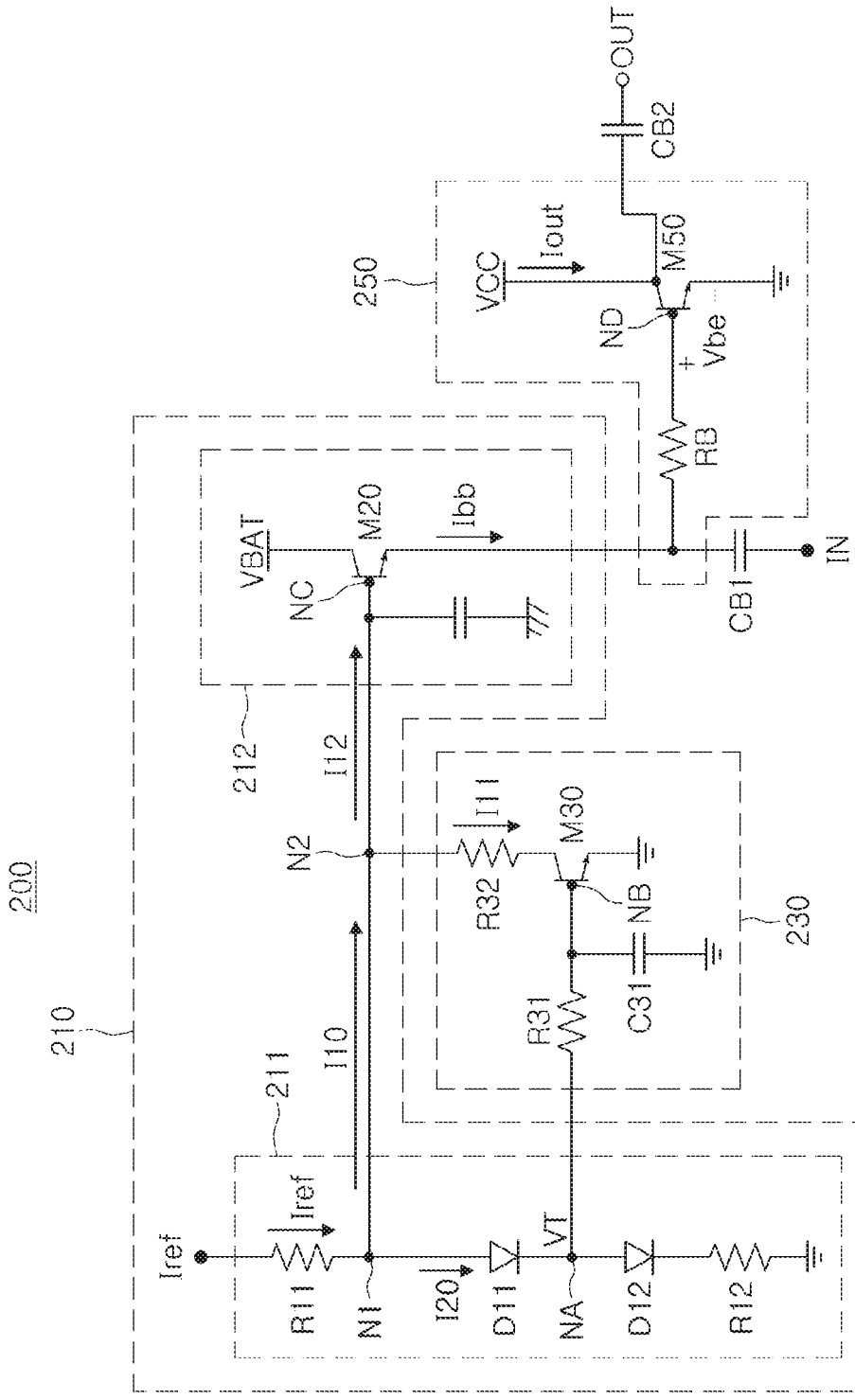
FIG. 3 is a view of a bias circuit and an amplification circuit according to an example.

FIG. 3 is a view of a bias circuit and an amplification circuit according to an example.

Referring to FIG. 3, the current generating circuit 211 may include a first resistor R11, a first diode D11, a second diode D12, and a second resistor R12.

The first resistor R11 may include one end connected to a terminal of the reference current Iref, and the other end connected to an anode of the first diode D11. The first diode D11 and the second diode D12 may be connected to each other in series between the other end of the first resistor R11 and one end of the second resistor R12. The first diode D11 may include an anode connected to the other end of the first resistor R11, and a cathode connected to an anode of the second diode D12. The second diode D12 may include an anode connected to the cathode of the first diode D12, and a cathode connected to one end of the second resistor R12. The second resistor R12 may include one end connected to the cathode of the second diode D12, and the other end connected to the ground.

In each of FIGS. 2 and 3, the current generating circuit 211 may output the temperature voltage VT to the temperature compensation circuit 230 at a connection node NA between the first diode D11 and the second diode D12. As an example, the second diode D12 may be manufactured to have temperature characteristics the same as temperature characteristics of a base-emitter PN junction of the amplifying transistor M50.

For example, when temperature characteristics of the amplifying transistor M50 are the same as temperature characteristics of the second diode D12, according to a temperature change, a threshold voltage Vth is also changed in the second diode D12 by the amount of change in which a threshold voltage Vth is changed in the amplifying transistor M50.

Accordingly, when a variation in a threshold voltage occurs in the amplifying transistor M50 according to a temperature change, a variation in a threshold voltage Vth also occurs in the second diode D12. Thus, for temperature compensation of the amplifying transistor M50, from a connection node NA between the first diode D11 and the second diode D12, a temperature voltage VT, in which a temperature change is reflected, may be output.

The bias output circuit 212 may amplify the internal base current I12 to generate a base bias current Ibb and output the base bias current Ibb to the amplifying circuit 250.

The bias output circuit 212 may include an output transistor M20. The output transistor M20 may include a base NC connected to a first connection node N1 between the first resistor R11 and the first diode D11, a collector connected to a terminal of a power supply voltage VBAT, and an emitter connected to the amplifying circuit 250.

The output transistor M20 may amplify the internal base current I12, input to the base NC, to output the base bias current Ibb through an emitter of the output transistor M20 to the amplifying circuit 250.

The temperature compensation circuit 230 may adjust the base bias current Ibb based on a temperature voltage VT, in which a change in ambient temperature is reflected.

For example, referring to FIG. 2, the temperature compensation circuit 230 may include a compensation transistor M30. Referring to FIG. 3, the temperature compensation circuit 230 may include a third resistor R31, a fourth resistor R32, a compensation transistor M30, and a first capacitor C31.

The third resistor R31 may include one end connected to the connection node NA between the first diode D11 and the second diode D12, and the other end connected to a base NB of the compensation transistor M30.

The fourth resistor R32 may include one end connected to a base of the output transistor M20, and the other end connected to a collector of the compensation transistor M30.

The compensation transistor M30 may include a base connected to the other end of the third resistor R31, a collector connected to the other end of the fourth resistor R32, and an emitter connected to the ground.

The first capacitor C31 may be connected between a base of the compensation transistor M30 and the ground.

The compensation transistor M30 may adjust a magnitude of a current I11 sinking to the ground, of the internal base current I10, according to a magnitude of the temperature voltage VT. Accordingly, the current I12, supplied to the base of the output transistor M20, may be adjusted. As a result, the base bias current Ibb, supplied through the output transistor M20, may be adjusted according to the current I12, input to the base of the output transistor M20.

For example, a change in ambient temperature is reflected in a temperature voltage VT, and a magnitude of a current I11 sinking to the ground is adjusted based on the temperature voltage VT. Accordingly, the base bias current Ibb, supplied through the output transistor M20, may be adaptively adjusted to a temperature change. Thus, the base bias current Ibb, varying according to a temperature change, may be adaptively compensated, resulting in reducing the amount of change of the base bias current Ibb according to a temperature change.

The third resistor R31 and the first capacitor C31 may form a low pass filter. Due to the low pass filter, the compensation transistor M30 may reflect an effect by a DC bias point moving adaptively, according to temperature.

The fourth resistor R32 provides a resistance value between a base of the output transistor M20 and a collector of the compensation transistor M30, thereby performing a function of strengthening the isolation between the RF signal of the base of the output transistor M20 and the collector of the compensation transistor M30.

The amplifying circuit 250 may include an amplifying transistor M50 receiving the base bias current Ibb.

As an example, the amplifying transistor M50 receives the base bias current Ibb through a base resistor RB to a base ND, receives a signal, input through an input terminal IN, through a first DC blocking capacitor CB1, to the base ND, amplifies the signal, having been input, and outputs the signal, having been amplified, through a second DC blocking capacitor CB2, connected to a collector, to an output terminal OUT.

To sum up, as a base bias point of the amplifying transistor M50 is increased at low temperature, a current, flowing through the amplifying transistor M50, and power gain are increased. In this case, due to an operation of the temperature compensation circuit 230, a current I11, sinking to the ground, is increased to decrease a base current I12 of the output transistor M20. Thus, the base bias current Ibb, output through the output transistor M20, may be reduced. As a result, a rising magnitude of a current, flowing through the amplifying transistor M50, may be reduced.

In other words, when the amplifying transistor M50 is operated at low temperature, as compared with room temperature operating conditions, a temperature voltage VT is higher. Accordingly, a voltage of a base of the compensation transistor M30 is increased, and a base voltage of the compensation transistor M30 is increased. In this case, while a current I11, sinking to the ground, is increased through the compensation transistor M30, a base current I12 of the output transistor M20 is relatively small. Thus, a base voltage of the amplifying transistor M50 is reduced. As a result, the compensation transistor M30 is used to lower a base voltage of the amplifying transistor M50, thereby having a temperature compensation effect.

In contrast, as a base bias point of the amplifying transistor M50 is decreased at high temperature, a current, flowing through the amplifying transistor M50, and power gain are decreased. In this case, due to an operation of the temperature compensation circuit 230, a current I11, sinking to the ground, is decreased to increase a base current I12 of the output transistor M20. Thus, the base bias current Ibb, output through the output transistor M20, may be increased. As a result, a decrease in a magnitude of a current, flowing through the amplifying transistor M50, may be reduced.

In other words, when the amplifying transistor M50 is operated at high temperature, as compared with room temperature operating conditions, a temperature voltage VT is lowered. Accordingly, a base voltage of the compensation transistor M30 is reduced. When the base voltage of the compensation transistor M30 is reduced, while a current I11, sinking to the ground, is decreased through the compensation transistor M30, a base current I12 of the output transistor M20 is relatively high. Thus, a base voltage of the amplifying transistor M50 is increased. As a result, the compensation transistor M30 is used to increase a base voltage of the amplifying transistor M50, thereby also having a temperature compensation effect at high temperature.

On the other hand, in the current generating circuit 211, each of the first diode D11 and the second diode D12 may be formed as a P-N diode by diode-connection of a base and a collector of HBT. The first resistor R11 and the second resistor R12 are bias resistors for formation of a proper bias point at room temperature.

Figure 4:
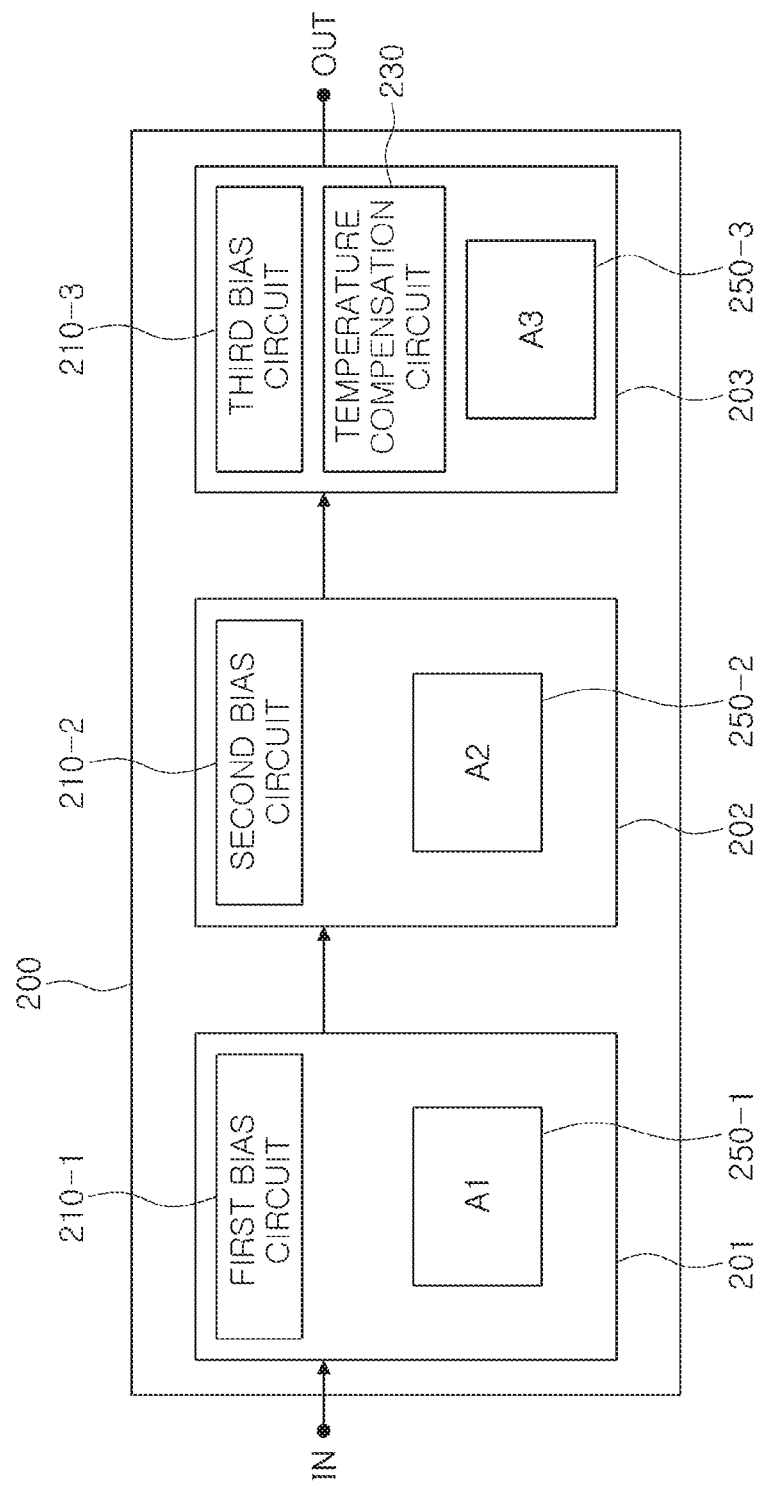
FIG. 4 is a view to which an amplifying device according to an example is applied.

FIG. 4 is a view to which an amplifying device according to an example is applied.

Referring to FIG. 4, an amplifying device according to an example may be applied to a 3-stage power amplifying device having three amplifying circuits, such as first, second, and third amplifying circuits 201, 202, and 203. The first amplifying circuit 201 may include a first bias circuit 210-1 and a first amplifying circuit A1 250-1. The second amplifying circuit 202 may include a second bias circuit 210-2 and a second amplifying circuit A2 250-2. The third amplifying circuit 203 may include a third bias circuit 210-3 and a third amplifying circuit A3 250-3.

The temperature compensation circuit 230 according to an example discussed above may be applied to at least one among the first amplifying circuit 201, the second amplifying circuit 202, and the third amplifying circuit 203.

In FIG. 4, an example is illustrated, in which the temperature compensation circuit 230 is applied to the third amplifying circuit 203, a final stage having a main impact on a performance change according to a temperature, among the first, second, and third amplifying circuits 201, 202, and 203 of the 3-stage power amplifying circuit.

Figure 5:
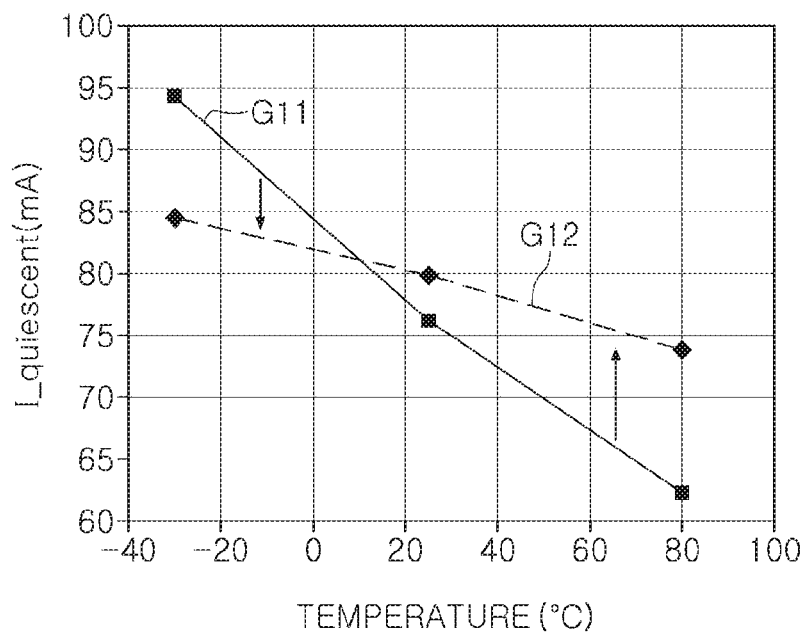
FIG. 5 is a graph illustrating temperature-Quiescent current characteristics.

FIG. 5 is a graph illustrating temperature-Quiescent current characteristics.

The graph of FIG. 5 is a graph illustrating characteristics of a temperature-Quiescent current according to the simulation result of a Quiescent current according to a temperature, when the bias circuit according to an example is applied to the third amplifying circuit 203, a final stage, among the first, second, and third amplifying circuits 201, 202, and 203 of the 3-stage power amplifying circuit of FIG. 4.

G11, illustrated in FIG. 5, is a graph of temperature-Quiescent current characteristics of a bias circuit according to the related art, while G12 is a graph of temperature-Quiescent current characteristics of a bias circuit according to an example.

G11 and G12 of FIG. 5 are results of simulation at 3-points of −30 degrees (low temperature), 25 degrees (room temperature), and 80 degrees (high temperature). Here, referring to G11 and G12, when a bias circuit according to the related art is applied, a deviation of a Quiescent current according to a temperature is to a level of 32 mA (62 mA to 94 mA). However, when a bias circuit including a temperature compensation circuit according to an example is applied, a deviation of a Quiescent current according to a temperature is reduced to 10 mA (74 mA to 84 mA), which is reduced to approximately one third of a previous level. Thus, a deviation of a bias point according to a temperature is reduced.

Figure 6A:
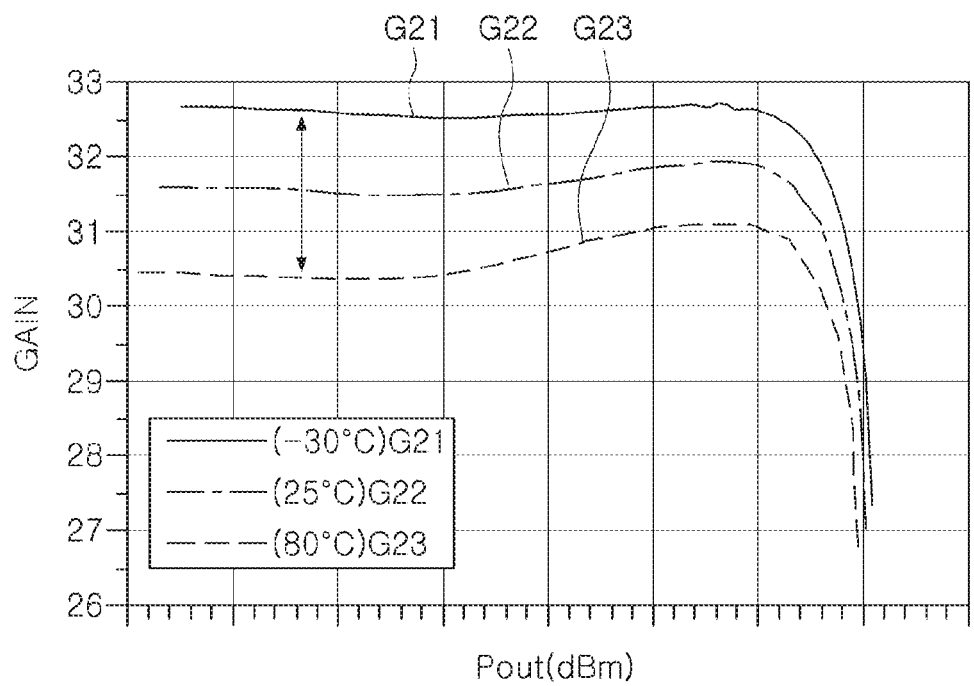
FIGS. 6A and 6B are graphs illustrating output power-gain characteristics according to a temperature change.
Figure 6B:
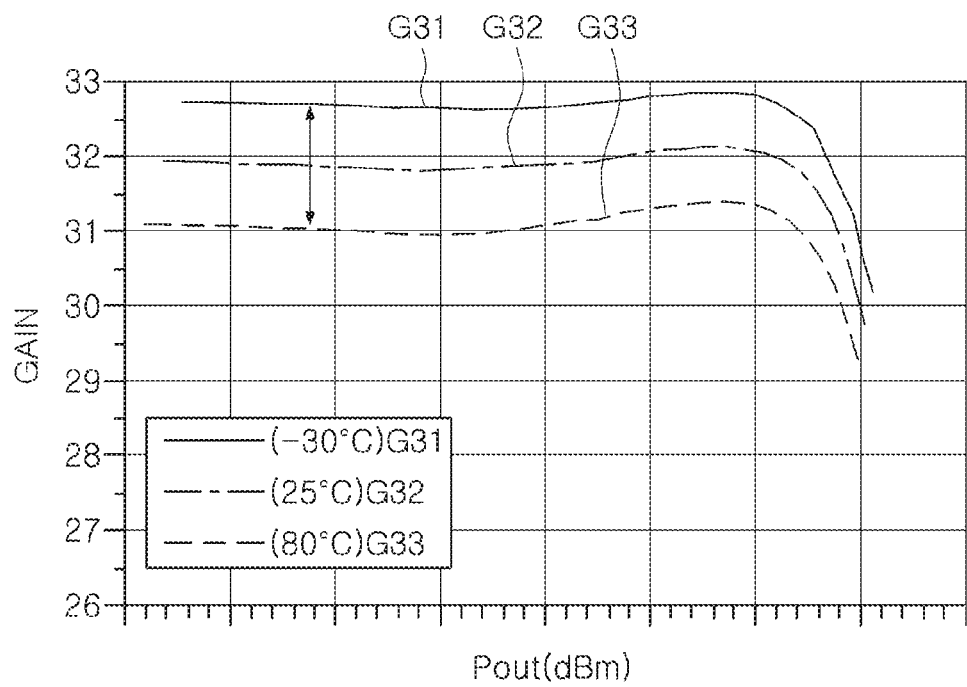

FIG. 6A is a graph of output power-gain characteristics according to a temperature change by a bias circuit according to the related art, while FIG. 6B is a graph of output power-gain characteristics according to a temperature change by a bias circuit according to an example.

Respective G21, G22, and G23 of FIG. 6A are graphs of output power-gain characteristics according to a temperature change by a bias circuit according to the related art, at respective 3-points of −30 degrees (low temperature), 25 degrees (room temperature), and 80 degrees (high temperature). Respective G31, G32, and G33 of FIG. 6B are graphs of output power-gain characteristics according to a temperature change by a bias circuit according to an example, at respective 3-points of −30 degrees (low temperature), 25 degrees (room temperature), and 80 degrees (high temperature).

Referring to G21, G22, and G23 of FIG. 6A, when a bias circuit according to the related art is applied, a deviation of power gain according to a temperature is up to a level of 2.2 dB. However, referring to G31, G32, and G33 of FIG. 6B, when a bias circuit having a temperature compensation circuit according to an example is applied, a deviation is reduced to about 1.5 dB.

Figure 7A:
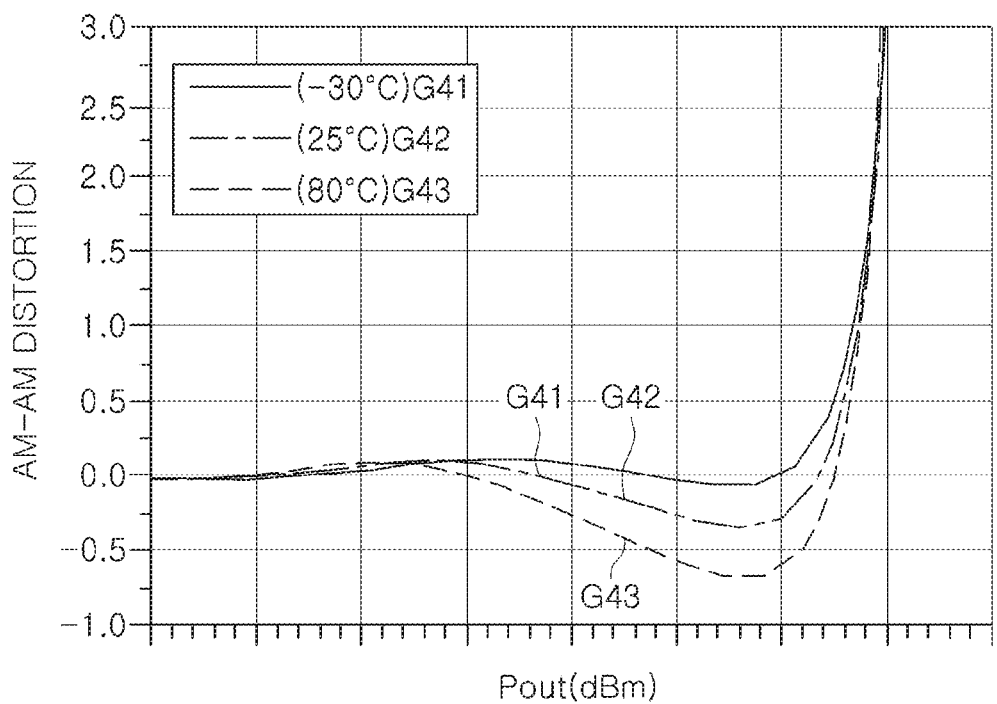
FIGS. 7A and 7B are graphs illustrating output power-AM-AM distortion characteristics according to a temperature change.
Figure 7B:
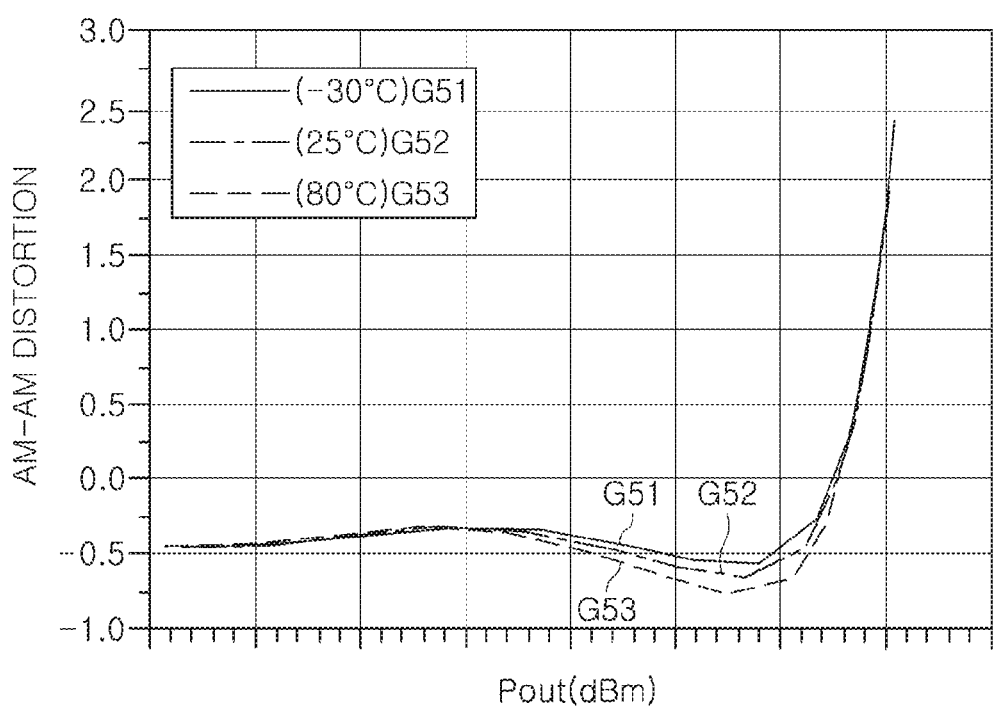

FIGS. 7A and 7B are graphs illustrating output power-AM-AM distortion characteristics according to a temperature change.

FIG. 7A is a graph of output power-AM-AM distortion characteristics according to a temperature change by a bias circuit according to the related art, while FIG. 7B is a graph of output power-AM-AM distortion characteristics according to a temperature change by a bias circuit according to an example.

Respective G41, G42, and G43 of FIG. 7A are graphs of output power-AM-AM distortion characteristics according to a temperature change by a bias circuit according to the related art, at respective 3-points of −30 degrees (low temperature), 25 degrees (room temperature), and 80 degrees (high temperature). Respective G51, G52, and G53 of FIG. 7B are graphs of output power-AM-AM distortion characteristics according to a temperature change by a bias circuit according to an example, at respective 3-points of −30 degrees (low temperature), 25 degrees (room temperature), and 80 degrees (high temperature).

Referring to G41, G42, and G43 of FIG. 7A, when a bias circuit according to the related art is applied, a deviation of output power-AM-AM distortion according to a temperature change is to a level of 0.7 dB. Referring to G51, G52, and G53 of FIG. 7B, when a bias circuit according to an example is applied, a deviation of output power-AM-AM distortion according to a temperature change is reduced to about 0.3 dB.

Figure 8A:
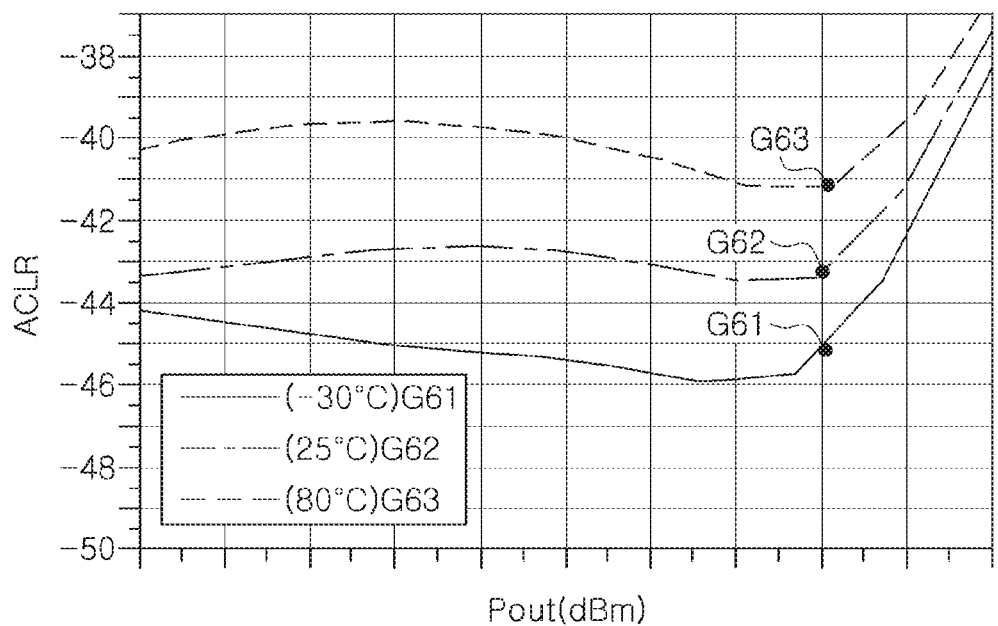
FIGS. 8A and 8B are graphs illustrating output power-ACLR characteristics according to a temperature change.
Figure 8B:
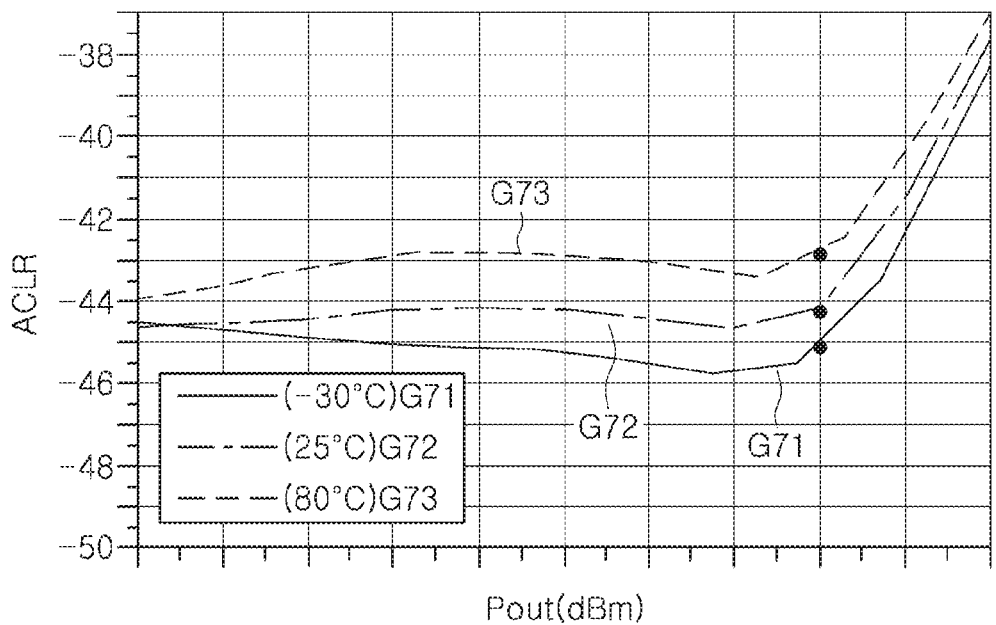

FIGS. 8A and 8B are graphs illustrating output power-ACLR characteristics according to a temperature change.

FIG. 8A is a graph of output power-Adjacent Channel Leakage Ratio (ACLR) characteristics according to a temperature change by a bias circuit according to the related art, while FIG. 8B is a graph of output power-ACLR characteristics according to a temperature change by a bias circuit according to an example.

Respective G61, G62, and G63 of FIG. 8A are graphs of output power-ACLR characteristics according to a temperature change by a bias circuit according to the related art, at respective 3-points of −30 degrees (low temperature), 25 degrees (room temperature), and 80 degrees (high temperature). Respective G71, G72, and G73 of FIG. 8B are graphs of output power-ACLR characteristics according to a temperature change by a bias circuit according to an example, at respective 3-points of −30 degrees (low temperature), 25 degrees (room temperature), and 80 degrees (high temperature).

Referring to G41, G42, and G43 of FIG. 8A, when a bias circuit according to the related art is applied, the output power-ACLR performance according to a temperature change is reduced by 5.5 dB. Referring to G71, G72, and G73 of FIG. 8B, when a bias circuit according to an example is applied, the output power-ACLR performance according to a temperature change may be reduced by 2.5 dB. Here, it is confirmed that a degree of degradation of linearity may be reduced.

A control circuit of an amplifying device according to an example may be implemented as a computing environment, in which processors (for example, a central processing unit (CPU), a graphics processing unit (GPU), a microprocessor, an application specific integrated circuit (ASIC), field programmable gate arrays (FPGA), and the like), a memory (for example, a volatile memory (e.g., RAM, and the like), a non-volatile memory (e.g., ROM, a flash memory), and the like), input devices (for example, a keyboard, a mouse, a pen, a voice input device, a touch input device, an infrared camera, a video input device, and the like), output devices (for example, displays, speakers, printers, and the like), and communications access devices (for example, modem, a network interface card (NIC), an integrated network interface, a radio frequency transmitter/receiver, an infrared port, a USB connection device, and the like) are interconnected to each other (for example, a Peripheral Component Interconnect (PCI), USB, firmware (IEEE 1394), an optical bus structure, a network, and the like).

The computing environment may be implemented as a distributed computing environment, including personal computers, server computers, handheld or laptop devices, mobile devices (mobile phones, PDAs, media players, and the like), multiprocessor systems, consumer electronics, minicomputers, mainframe computers, or the above systems or devices, but is not limited thereto.

According to the examples discussed herein, in a current bias circuit, temperature characteristics of a diode and a current sinking method for reflecting a change in ambient temperature are used, to compensate a base bias current, which may vary depending on an ambient temperature, and improve a performance deviation such as a gain deviation according to a temperature change, a deviation of AM-AM distortion, a deviation of linearity, and the like.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bias circuit, comprising:
   a current generating circuit configured to generate an internal base current based on a reference current, and comprising a first diode and a second diode connected to each other between a terminal of the reference current and a ground;
   a bias output circuit configured to generate a base bias current based on the internal base current and output the base bias current to an amplifying circuit; and
   a temperature compensation circuit configured to sink a current from the internal base current and regulate the base bias current, based on a temperature voltage reflecting a change in ambient temperature,
   wherein the current generating circuit is further configured to output the temperature voltage at a connection node between the first diode and the second diode, and
   wherein the current sinking from the internal base current decreases in response to the ambient temperature rising, and the base bias current increases in response to the ambient temperature rising.

2. The bias circuit of claim 1, wherein the current generating circuit further comprises:
   a first resistor having a first end connected to the terminal of the reference current; and a second resistor having a second end connected to the ground, wherein the first diode and the second diode are connected to each other in series between a second end of the first resistor and a first end of the second resistor.

3. The bias circuit of claim 2, wherein the second diode is configured to have temperature characteristics the same as temperature characteristics of a base-emitter PN junction of an amplifying transistor included in the amplifying circuit.

4. The bias circuit of claim 3, wherein the bias output circuit comprises:
an output transistor having a base connected to a connection node between the first resistor and the first diode, a collector connected to a terminal of a power supply voltage, and an emitter connected to the amplifying circuit.

5. The bias circuit of claim 4, wherein the output transistor is configured to amplify the internal base current, input to the base, and to output the base bias current through the emitter.

6. The bias circuit of claim 5, wherein the temperature compensation circuit comprises:
a third resistor having a first end connected to a connection node between the first diode and the second diode;
a fourth resistor having a first end connected to a base of the output transistor;
a compensation transistor having a base connected to a second end of the third resistor, a collector connected to a second end of the fourth resistor, and an emitter connected to the ground; and
a first capacitor connected between the base of the compensation transistor and the ground,
wherein the fourth resistor is configured to provide an isolation function between the collector of the compensation transistor and the base of the output transistor, and
the third resistor and the first capacitor are configured to form a low pass filter.

7. The bias circuit of claim 6, wherein the compensation transistor is configured to regulate the current sinking from the internal base current according to a magnitude of the temperature voltage.

8. An amplifying device, comprising:
a current generating circuit configured to generate an internal base current based on a reference current, and comprising a first diode and a second diode connected to each other between a terminal of the reference current and a ground;
a bias output circuit configured to generate a base bias current based on the internal base current;
an amplifying circuit including an amplifying transistor configured to receive the base bias current; and
a temperature compensation circuit configured to sink a current from the internal base current and regulate the base bias current, based on a temperature voltage that reflects a change in ambient temperature,
wherein the current generating circuit is further configured to output the temperature voltage at a connection node between the first diode and the second diode, and
wherein the current sinking from the internal base current decreases in response to the ambient temperature rising, and the base bias current increases in response to the ambient temperature rising.

9. The amplifying device of claim 8, wherein the current generating circuit further comprises:
a first resistor having a first end connected to the terminal of the reference current; and a second resistor having a second end connected to the ground, wherein the first diode and the second diode are connected to each other in series between a second end of the first resistor and a first end of the second resistor.

10. The amplifying device of claim 9, wherein the second diode is configured to have temperature characteristics the same as temperature characteristics of a base-emitter PN junction of the amplifying transistor.

11. The amplifying device of claim 10, wherein the bias output circuit comprises:
an output transistor having a base connected to a connection node between the first resistor and the first diode, a collector connected to a terminal of a power supply voltage, and an emitter connected to a base of the amplifying transistor.

12. The amplifying device of claim 11, wherein the output transistor is configured to amplify the internal base current input to the base, and to output the base bias current through the emitter.

13. The amplifying device of claim 12, wherein the temperature compensation circuit comprises:
a third resistor having a first end connected to the connection node between the first diode and the second diode;
a fourth resistor having a first end connected to the base of the output transistor;
a compensation transistor having a base connected to a second end of the third resistor, a collector connected to a second end of the fourth resistor, and an emitter connected to the ground; and
a first capacitor connected between the base of the compensation transistor and the ground,
wherein the fourth resistor is configured to provide an isolation function between the collector of the compensation transistor and the base of the output transistor, and
wherein the third resistor and the first capacitor are configured to form a low pass filter.

14. The amplifying device of claim 13, wherein the compensation transistor is configured to regulate the sunk current sinking from the internal base current according to a magnitude of the temperature voltage.

15. An apparatus, comprising:
a first transistor configured to generate and output a base bias current based on a received internal base current;
a second transistor configured to receive the base bias current;
a third transistor configured to adjust a base voltage of the second transistor based on a change in ambient temperature;
a first diode; and
a second diode connected in series with the first diode,
wherein the apparatus is configured to output a temperature voltage, corresponding to a change in ambient temperature, to a base of the third transistor at a connection node between the first diode and the second diode,
wherein a current of the internal base current sinking to a ground through the third transistor decreases in response to the ambient temperature rising, and
wherein the base bias current increases in response to the ambient temperature rising.

16. The apparatus of claim 15, wherein temperature characteristics of the second diode are the same as temperature characteristics of the third transistor.

17. The apparatus of claim 15, wherein the third transistor is further configured to adjust a magnitude of the current of the internal base current sinking to the ground based on a magnitude of the temperature voltage.

18. The bias circuit of claim 1, wherein the bias output circuit is directly connected to a node between a first resistor of the current generating circuit and the first diode of the current generating circuit.

* * * * *